United States Patent [19]

Butt et al.

[11] Patent Number: 4,849,857
[45] Date of Patent: Jul. 18, 1989

[54] HEAT DISSIPATING INTERCONNECT TAPE FOR USE IN TAPE AUTOMATED BONDING

[75] Inventors: Sheldon H. Butt, Godfrey, Ill.; Scott V. Voss, Portola Valley, Calif.

[73] Assignee: Olin Corporation, New Haven, Conn.

[21] Appl. No.: 105,141

[22] Filed: Oct. 5, 1987

[51] Int. Cl.⁴ ............................................. H05K 7/20
[52] U.S. Cl. ................................... 361/388; 29/827; 428/573; 206/330; 357/70; 361/421
[58] Field of Search ............... 428/572, 573; 29/827; 174/68.5, 52 PE, 52 FP; 165/80.3, 185; 206/328, 329, 330, 331, 820; 357/70, 81; 361/398, 421, 383, 386, 387, 388, 401, 403, 414

[56] References Cited

U.S. PATENT DOCUMENTS

| | | |
|---|---|---|
| 3,611,061 | 10/1971 | Segerson ............................ 428/572 |
| 3,802,069 | 4/1974 | Thompson .......................... 29/827 |
| 3,821,847 | 7/1974 | Melse ................................... 29/827 |
| 4,209,355 | 6/1980 | Burns . |
| 4,234,666 | 11/1980 | Gursky . |
| 4,385,202 | 5/1983 | Spinelli et al. . |
| 4,394,530 | 7/1983 | Kaufman ........................... 361/388 |
| 4,410,927 | 10/1983 | Butt . |
| 4,449,165 | 5/1984 | Kaufman ........................... 361/421 |
| 4,472,876 | 9/1984 | Nelson . |
| 4,474,292 | 10/1984 | Tehrani ............................. 206/329 |
| 4,510,017 | 4/1985 | Barber . |
| 4,514,750 | 4/1985 | Adams ............................. 174/52 FP |
| 4,524,238 | 6/1985 | Butt . |
| 4,607,276 | 8/1986 | Butt . |
| 4,656,499 | 4/1987 | Butt . |
| 4,684,975 | 8/1987 | Takiar et al. . |
| 4,701,363 | 10/1987 | Barber . |
| 4,704,187 | 11/1987 | Fujita ................................. 357/70 |
| 4,721,993 | 1/1988 | Walter . |
| 4,735,678 | 4/1988 | Mandigo et al. . |
| 4,736,236 | 4/1988 | Butt . |
| 4,736,882 | 4/1988 | Winter et al. . |
| 4,742,024 | 5/1988 | Sugimoto et al. . |

OTHER PUBLICATIONS

"TAB Technology Tackles High Density Interconnections" by Tom Dixon, *Electronic Packaging & Production*, Dec. 1984, pp. 34–39.
"Future Packages' Heat Transfer Will Affect PCB Designs" by Ernel R. Winkler, *Electronic Packaging & Production*, Apr. 1985, pp. 104–109.
"Advanced Packaging for VLSI" by Charles J. Bartlett, *Solid State Technology*, Jun. 1986, pp. 119–123.
"Microelectronic Packaging" by Albert J. Blodgett, Jr., *Scientific America*, Jul. 1983, pp. 86–96.

Primary Examiner—Gerald P. Tolin
Attorney, Agent, or Firm—Gregory S. Rosenblatt; Paul Weinstein

[57] ABSTRACT

The present invention is directed to an interconnect tape for TAB and electronic packages made from the tape. A heat dissipating pad positioned over the electrically active face of an electronic device transfers heat from the device to the electronic package or to an external heatsink. The tape leads, the heat dissipating pad and the support members for the heat dissipating pad are all formed from the same electrically conductive strip.

34 Claims, 4 Drawing Sheets

PRIOR ART

HEAT DISSIPATING INTERCONNECT TAPE FOR USE IN TAPE AUTOMATED BONDING

This invention relates to an improved heat dissipating interconnect tape for use in tape automated bonding (hereinafter referred to as TAB). Integrated circuits made from semiconductor materials are increasing in size, operating speeds and circuit density. The packaging for these electronic devices must adapt to meet the improvements. Two areas in which electronic packages must be adapted are to support the increased number of bonding sites on the chip and increased power generated by the increased size and circuit density.

One way to address the increased circuit density is the use of TAB instead of conventional wire bonding. TAB permits closer spacing of interconnect bonding pads on a semiconductor die than would be achievable by wire bonding. A general review of TAB technology is set forth in an article entitled "TAB Technology Tackles High Density Interconnections" by Tom Dixon, which appeared in the December, 1984, volume of *Electronic Packaging & Production*, at pages 34–39.

There are three general forms of TAB construction. The first is a single layer or all metal construction; the second is a two layer construction comprising a metal layer with a dielectric backing such as a polyimide; and the third is a three layer construction comprising a metal layer adhesively bonded to a dielectric such as KAPTON polyimide. Further details concerning these respective constructions can be obtained from a review of the aforenoted Dixon article.

A TAB interconnect generally comprises a plurality of narrow leads arranged to extend outwardly from a semiconductor die such that the inner lead portions are adapted to be bonded to the semiconductor die contact pads and the outer lead portions are adapted to bond to a lead frame, circuit board, etc. as desired. In the single layer version, a metal frame supports the elongated leads; whereas in the two or three layer versions, a polyimide substrate supports the leads.

The TAB process involves first bonding the inner lead portions of the TAB tape to the semiconductor device followed by excising the leads from the tape frame or support substrate and then bonding the outer lead portions to the desired lead frame, package circuitry or printed circuitry, as desired. The TAB leads are formed from a metal foil, such as copper foil and are relatively thin, typically about ½ to about 6 mils thick. The thinness of the TAB foil permits the interconnects to be placed more closely together thereby allowing high density interconnection at the semiconductor chip.

TAB tapes may be bumped or unbumped. The bumps act in part as mechanical standoffs from the chip. Unbumped tapes require that the semiconductor chips be bumped in order to make the desired thermal compression bond between the inner lead portion of the TAB leads and the chip. Bumped tape eliminates the need for bumping of the wafer and, therefore, permits the TAB interlead bond portions to be bonded directly to ordinary semiconductor die bonding pads. The bumped tape normally has a copper projection bump positioned at the point where it is to be joined to the die. This bump may, if desired, be covered with a suitable plating such as gold, tin or nickel.

The second area in which electronic packages require adaptation is thermal dissipation. A general review of the thermal dissipation requirements for electronic packaging may be found in the articles entitled "Future Packages' Heat Transfer Will Affect PCB Designs", by Ernel R. Winkler, which appeared in the April, 1985, volume of *Electronic Packaging & Production* at pages 104–109, and "Advanced Packaging For VLSI", by Charles J. Bartlett, which appeared in the June, 1986, volume of *Solid State Technology*, at pages 119–123.

A key objective in designing an electronic package is to limit the chip temperature to a maximum acceptable value. When an electric current is passed through the chip, the current encounters a certain amount of resistance. This resistance results in the generation of heat. It follows that the more circuits on the chip, the greater the heat generation. It is also known that a 10° C. rise in chip temperature typically reduces the chip lifetime by about 50%. Ideally, the chip temperature should be maintained below about 85° C.

Bartlett gives several formulas which quantify the factors which determine the operating temperature of the chip. The chip junction temperature is a function of the power generated by the chip minus the heat dissipated by the package. There are essentially three routes for heat dissipation: by conduction through the base of the chip, by conduction through the leads, and by conduction, convection, or radiation through the face of the chip.

Most semiconductor devices have circuitry located on one face of the semiconductor chip. The chip is usually silicon although the use of germanium or gallium arsenide is also known. A variety of physical and chemical processes are employed to form the desired integrated circuit structure on this face. As electric current passes through the circuitry, heat is generated. Many different mechanisms to remove the heat have been proposed. For example, Butt U.S. Pat. No. 4,410,927 illustrates several electronic package embodiments with heatsinks incorporated into the package base. Spinelli et al. U.S. Pat. No. 4,385,202 illustrates printed circuit boards to which a semiconductor package may be mounted. Running through the circuit board is a heat sink means. The aforementioned article by Winkler illustrates several heat sink means.

A common mechanism runs through the above-mentioned heat sink methods. All consist of a heatsink means located either at or below the interface of the package base and the semiconductor device. As heat is generated at the electrically active face a finite amount of time is required for the heat to pass through the thickness of the semiconductor chip and usually a substrate material before reaching the heat sink for transportation away from the device.

Heat is removed from the active face of the semiconductor die by convection through air. To improve heat dissipation by convection, forced air has been used as have gases other then air. For example, the article entitled, "Microelectronic Packaging" by Albert J. Blodgett, Jr., in the July, 1983, volume of *Scientific American*, at Pages 86–96 shows the use of helium which has a higher convective heat transfer coefficient than air.

The leads have been utilized as conductive heatsinks. U.S. Pat. No. 4,684,975 to Takiar et al. discloses metal tape leads which extend inward from the bonding pads to remove heat from the central regions of a semiconductor device.

Yet another means to improve heat dissipation is shown in U.S. Pat. No. 4,524,238 to Butt where the package lid is in direct contact with the chip or alternatively, a thermally conductive spring extends from the lid to make contact with the chip. Another thermal dissipation method is disclosed in the U.S. Pat. No. 4,607,276 to Butt in which a spring device is affixed to the base of the package and acts as a grounding contact for the semiconductor device and also pushes the chip against the package lid to create a thermal dissipation path.

The manufacture of tapes for tape automat d bonding (TAB) is well known illustrated in U.S. Pat. No. 4,209,335 to Burns and U.S. Pat. No. 4,234,266 to Gursky. The advantages of TAB interconnect tapes for high density packages are well described in the aforementioned article by Dixon.

The aim of the present invention is to provide an interconnect tape and electronic packaging means whereby the number of interconnects may be increased and the corresponding increased heat generated will be removed by an effective means of thermal dissipation.

It is an advantage of the present invention to apply a thermal dissipation means which is in contact with the heat generating face of the chip.

It is another advantage of the present invention to provide a thermal dissipation means which is incorporated within the interconnect tape, and thermally isolated from the leads.

It is another advantage of the present invention to use the interconnect tape to improve thermal dissipation of TAB packaging.

It is yet another advantage of this invention to provide for the use of TAB tape to improve the thermal dissipation of a molded plastic electronic package.

Accordingly, there has been provided an interconnect tape for use in tape automated bonding with a heat dissipating pad positioned on the heat generating face of a semiconductor chip. The interconnect tape is comprised of at least one electrically conductive strip; at least one lead pattern in the strip including at least one cluster of leads which have free ends that project toward the center of the cluster and opposite ends supported by said strip; a heat dissipating pad spaced apart from and centrally of the free ends of said leads; and at least one support member extending outward from said heat dissipating pad and affixed to the electrically conductive strip.

These and other aims will become more apparent from the following description and drawings in which like elements have been given like reference numbers and in which prime or multiprime numbers comprise similar elements providing similar functions.

Figure 1:
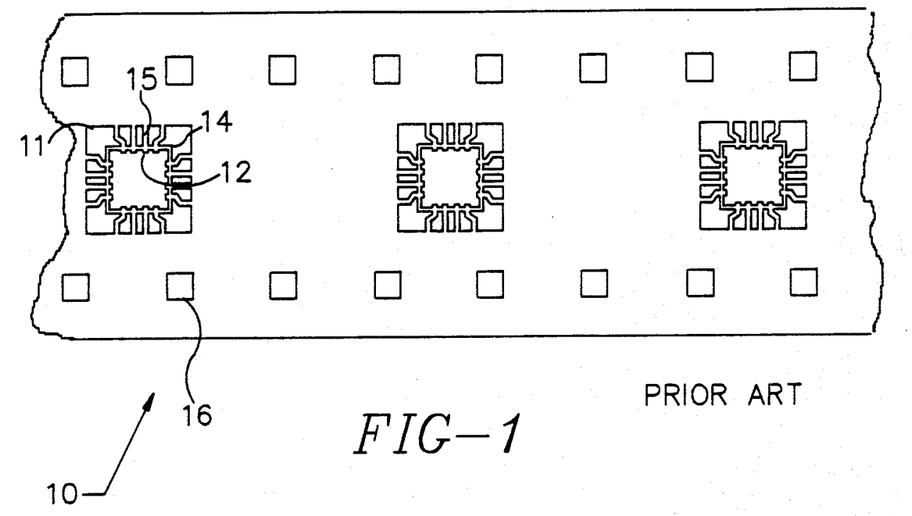
FIG. 1 is a schematic representation of an interconnect tape as known in the prior art.

FIG. 1 illustrates prior art. An interconnect tape 10 contains a plurality of leads 11 said leads have an inner end portion 12 for connection to an electronic device, typically a semiconductor die and an outer end portion 15 for connection to a leadframe or other method of making contact with the outside world. Index holes 16 are used to align the interconnect tape for automated bonding to semiconductor chips according to well known means. The leads are usually quite narrow to permit a high density of interconnects. The leads are susceptible to distortion during assembly. To prevent bending, a tie bar 14 is often used to keep the leads straight. Once the interconnect tape is in position relative to a semiconductor package, the leads are separated from the tape carrier by, for example, a cutting or stamping operation. Additionally, the tie bar is removed from the leads.

Figure 2:
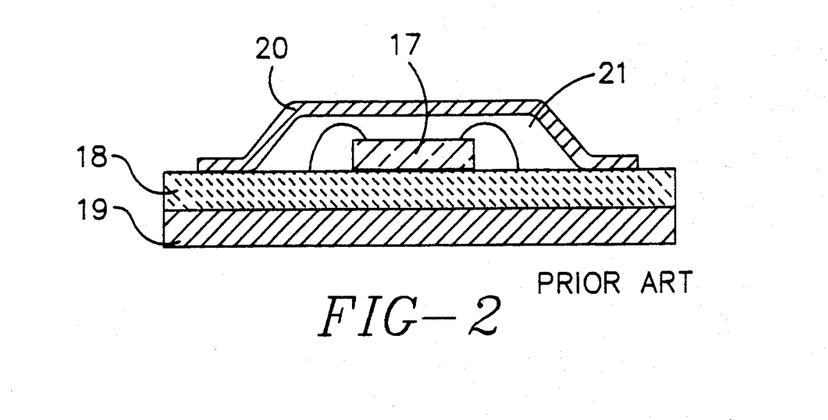
FIG. 2 is a schematic representation of an electronic package incorporating a heat sink means in the base of the semiconductor package.

FIG. 2 illustrates a prior art electronic package adapted to house a semiconductor including device one method for removing heat from the device. A semiconductor device 17 also known as a die is enclosed in an electronic package comprised of a package base 18 and a package cover 20. Heat is removed through the package base via a heatsink 19 and through the chip face by convection currents in the air 21 sealed within the package.

The package base is usually made from a ceramic or metal material with a coefficient of thermal expansion approximately the same as the coefficient of thermal expansion of the semiconductor device, for example aluminum oxide or Alloy 42. The base material is usually a poor conductor of heat. The heatsink is usually a material with high thermal conductivity such as copper or aluminum. Since the heatsink materials generally have coefficients of thermal expansion much larger than the semiconductor device, the device is usually not affixed directly to the heatsink.

Figure 3:
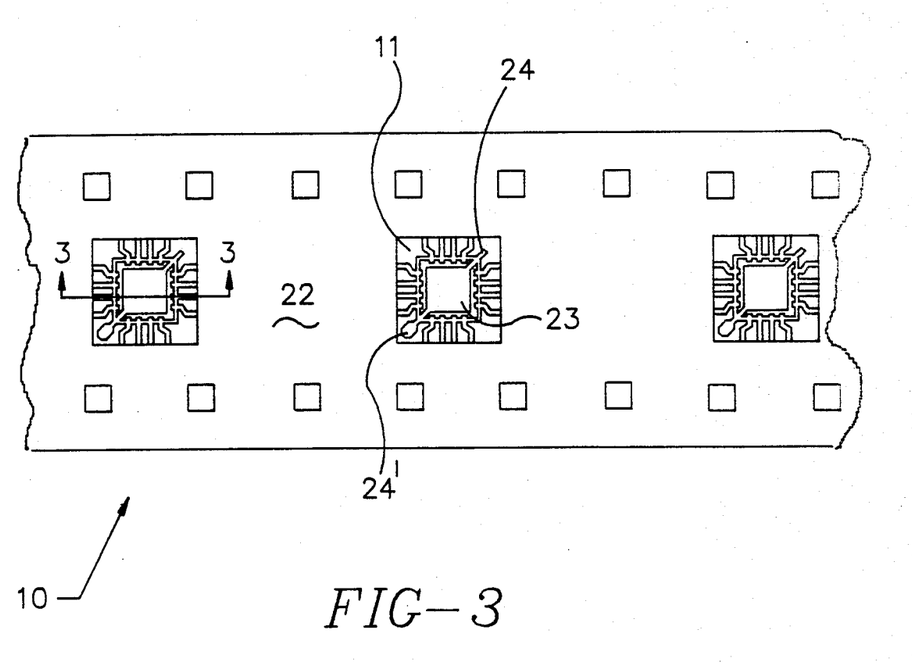
FIG. 3 is a schematic representation of the interconnect tape in accordance with the present invention.

FIG. 3 is a schematic representation of the interconnect tape 10' claimed in the present invention. At least one electrically conductive strip 22 with at least one lead pattern within the strip including at least one cluster of leads 11 which have free end portions 12 that project toward the center of the cluster and opposite end portions 15 supported by the strip. A heat dissipating pad 23 is spaced apart from and positioned centrally of the inner end portion 12 of said leads. There is at least one support member 24 extending outward from the heat dissipating pad which is held in place by the tie bar 14.

In accordance with the present invention the leads 11, the heat dissipating pad 23 and the support members 24 are all fabricated from the same electrically conductive strip 22. The strip is generally fabricated of a formable material of relatively high thermal conductivity, for example, a copper or copper based alloy. The strip thickness ranges up to about 0.01 inches and preferably from about 0.0005 inches to about 0.006 inches. The interconnect tape may be homogeneous or it may be a multi-layer laminate. The laminate has at least one electrically conductive layer bonded to at least one electrically insulating layer.

The lead pattern 11, the heat dissipating pad 23 and the support members 24 are formed by a known process, such as a selective chemical etch. If the interconnect tape is homogeneous, such as solid copper, a tie bar 14 is formed by the same process. The formed parts are supported by a surrounding electrically conductive strip 22. Once the leads are bonded to a semiconductor device, the electrically conductive strip and tie bar are removed by stamping or an equivalent process.

If the interconnect tape is a laminate, for example a three layer laminate comprising two copper layers separated by a non-conductive polyimide layer, the leads are formed from one copper layer and the heat dissipating pad and the support members are formed from the second copper layer. A tie bar is not necessarily required as the leads are supported by the polyimide layer. The leads are bonded to a semiconductor die and the electrically conductive strip is removed.

As discussed hereinbefore, the leads of a tape package have been used to conduct heat from the electrically active face of a semiconductor device. Heat is a form of energy and is absorbed by the atoms that make up the heat dissipators. As the atoms of the leads absorb energy, the electrons surrounding the atoms become more agitated. With increased vibration about the atomic centers, the number of free electrons being reflected or deflected is greatly increased and the electrical conductivity of the leads is decreased. The heat dissipating pad is designed to minimize heat conduction through the leads to maintain the electrical conductivity of the leads.

The support fingers 24' serve to conduct heat away from the heat dissipating pad and the semiconductor device. The heat is transferred from the support fingers to the body of the electronic package or as will be discussed below to an external heatsink or the outside air. The greater the surface area of the support fingers, the greater the ability of those support fingers to transfer heat. To maximize thermal transport, the support fingers are expandable to occupy the available area between adjoining leads.

While FIG. 3 illustrates a continuous web to supply the strip of electrically conductive material, TAB circuitry may also be supplied in the form of sticks of several lead patterns or as single lead pattern sites supplied in a slide like carrier.

Figure 4A:
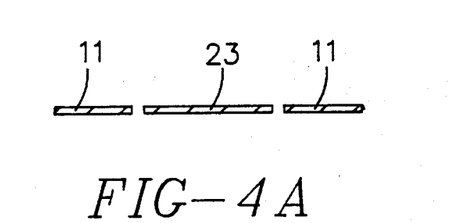
FIG. 4A is a cross-sectional representation of a preferred embodiment showing the position of the heat dissipating pad in relationship to the leads.

FIG. 4A is a cross-sectional representation of a preferred embodiment. The electrically conductive strip is a single layer of a relatively high thermal conduction material, such as homogeneous copper or a copper alloy, which is formed into leads 11 and heat dissipating pad 23.

Figure 4B:
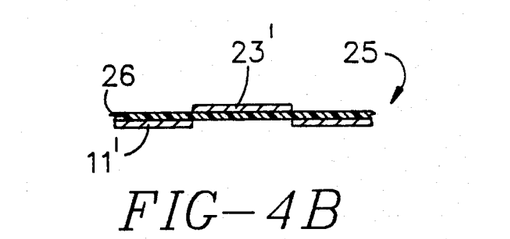
FIG. 4B is a cross-sectional representation of a second embodiment showing the position of the heat dissipating pad in relationship to the leads.

In another preferred embodiment shown in FIG. 4B, the leads 11' and the heat dissipating pad 23' are fabricated from the same strip of multi-layer laminate 25. A first copper or copper based alloy layer 11' and a second copper or copper based alloy layer 23' are separated by a nonconducting layer 26. The first copper or copper based alloy layer is formed into leads by a know technique such as selective photoetching and the second copper layer is formed into a heat dissipating pad by a similar or equivalent technique.

Figure 5:
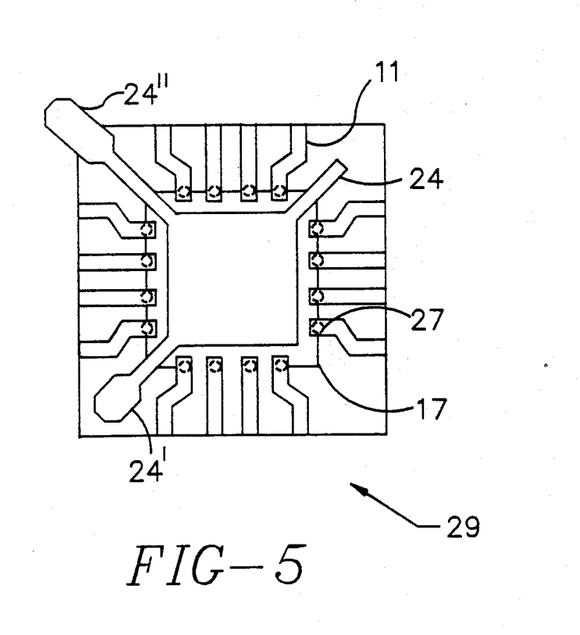
FIG. 5 is a schematic representation of the interconnect tape showing the relationship of the heat dissipating pad to the leads and to a semiconductor device.

FIG. 5 is a schematic representation of the heat dissipating pad 23 in an anticipated position, on the electrically active face namely the face containing the electrical interconnections of an electronic device 17. The inner lead portions 12 terminate at electrically active bonding sites 27 and are attached to the chip by a suitable lead bonding process such as ultrasonic bonding, compression bonding, or thermal compression bonding.

The support fingers 24 are bonded to a package base component 29 by any suitable bonding means. The bonding means may include soldering, welding, simple mechanical contact, or any other method which will keep the support means in a fixed position and in relatively close proximity to the base component.

The thermal dissipation ability of the heat dissipating pad may be further improved by incorporating the support means as a heat spreader. The support means 24' illustrates one such spreader. By increasing the surface area, more heat may be transferred to the surrounding package. The size and shape of the support means are limited only by the size of the package and the lead position. The support means should remain electrically isolated from the leads.

Nothing in the specification is intended to limit the heat spreader to the package interior. 24" shows a possible embodiment in which the support means extend beyond the package boundaries. The external end of the support means may dissipate heat to the environment by convection or by conduction to an external heatsink (not shown).

Figure 6:
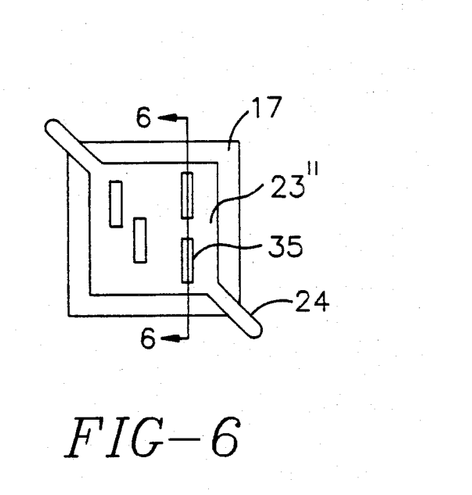
FIG. 6 is a schematic representation of an embodiment showing heat dissipating fins attached to the heat dissipating pad.

FIG. 6 illustrates another embodiment of the present invention. The heat dissipating pad 23" has heat dissipating fins 35 affixed angularly to the pad and extending outwardly.

The fins serve several functions. First by increasing the effective surface area of the heat dissipating pad, the amount of heat which may be dissipated by convection is increased. Also, the fins extend angularly from the heat dissipating pad. A forced air current flowing across the face of the semiconductor device would impinge upon the fins increasing the efficiency of the fins to transfer heat to the forced air.

Figure 7:
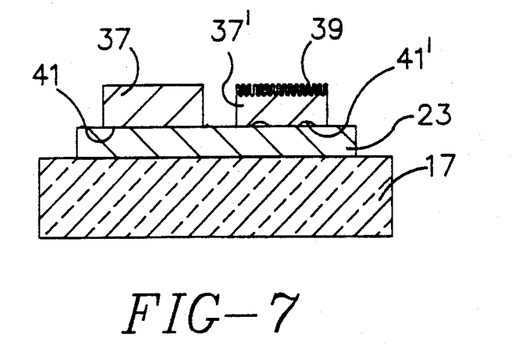
FIG. 7 is a cross-sectional representation along the line 6—6 in FIG. 6 and illustrates the positioning of the fins on the heat dissipating pad.

FIG. 7 shows the positioning of the heat dissipating fins in cross-sectional representation along line 6—6. The fin base 41 is bonded to the heat dissipating pad by any conventional means such as soldering or epoxy. The fin base may be continuous or perforated. A perforated base 41' is useful to reduce stresses in the semiconductor chip which may be introduced by the fins and heat dissipating fins as discussed hereinafter.

The fins may be flat or combed across the nonbonded edges 39. Combing increases the surface area of the fin resulting in improved heat removal. There may be one or more fins, the number and the spacing are dependent upon the individual heat dissipating requirements of the semiconductor device.

Figure 8:
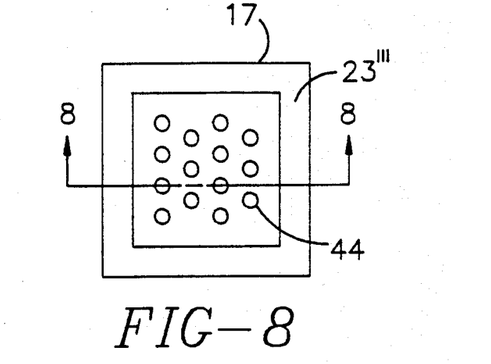
FIG. 8 is a schematic representation of a method to reduce the thermal stresses generated by the heat dissipating pad.
Figure 9:
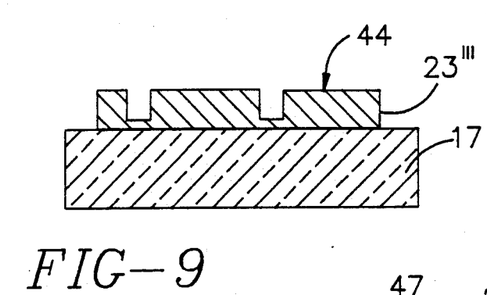
FIG. 9 is a cross-sectional representation along the line 8—8 in FIG. 8 of the method to reduce thermal stresses generated by the heat dissipating pad.

Most materials expand when heated. The expansion rate is dependent upon the material and each material has a distinct coefficient of thermal expansion. The heat dissipating pad, which is preferrably composed of a material with a high coefficient of thermal conductivity such as copper or copper alloy, will most likely have a significantly larger coefficient of thermal expansion than the semiconductor device. The thermal expansion mismatch may introduce unwanted stresses into the electronic device. It is an embodiment of the present invention to introduce stress relieving members within the heat dissipating pad 23''' as illustrated in FIG. 8. The stress relieving device may take the form of a series of holes 44. The holes need not be round, rather whatever shape is most effective for stress relief. Additionally, any pattern of a plurality of holes may be provided. FIG. 9 is a cross-sectional representation of the heat dissipating pad of FIG. 8 along line 8—8. The means for fabricating these stress relief holes are many. One method would be a selective chemical etch. Preferably the holes do not extend through the entire thickness of the heat dissipating pad. Heat dissipation by conduction through the heat dissipating pad 23''' is more efficient than by convection through the hole 44.

Figure 10A:
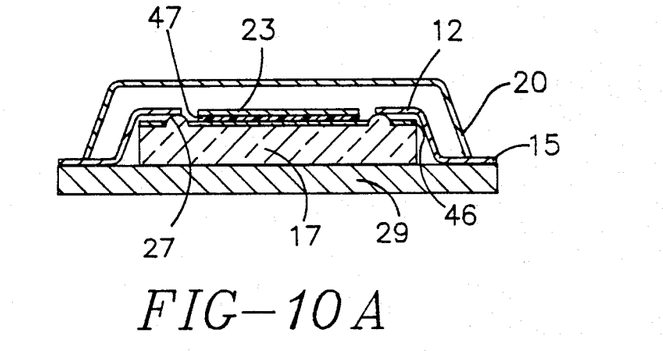
FIG. 10A is a cross-sectional representation of a TAB package incorporating a preferred embodiment of the present invention.

FIG. 10A is a schematic representation of a heat dissipating TAB tape according to the present invention incorporated into a tape package adapted to house an electronic component. The package contains a base component 29 and a cover component 20 bonded to the base component to create an enclosure suitable for housing an electronic device 17. The base component is usually a material with a coefficient of thermal expansion close to that of the electronic device. The interconnect tape is disposed between the base component and the cover component. The base component and cover component are bonded together with a suitable insulating material so that outer lead portions 15 are electrically isolated from each other as well as from the package components. A suitable material if a hermetic package is desired is a sealing glass such as those disclosed in U.S. Pat. No. 4,656,499 to Butt. If hermeticity is not a requirement, a polymer chosen from the class consisting of thermosetting and thermoplastic polymer resins may be chosen, for example an epoxy.

The outer lead portion could pass through or terminate at positions along the base or cover such that electrical isolation and contact with the outside world is maintained. A method, not shown, would be to terminate the leads at electrically conductive pads located along a ceramic base component. The pads would be terminations to conductive vias. The vias pass through the ceramic base component to leads or printed circuitry. When the leads do not pass through the base/cover interface, the base may be bonded to the cover with an electrically conductive material, for example, a metallic solder.

The TAB tape contains inner lead portions 12 which are connected to bonding sites 25 of the electronic device. Outer lead portions 15 extend beyond the electronic package for connection to a printed circuit board or other electronic device. The heat dissipating member 23 is affixed to the semiconductor chip by an adhesive 47.

The adhesive may be any compliant thermally conductive material. Compliancy is an important factor. Stresses generated by a coefficient of thermal expansion mismatch between the electronic device and the heat dissipating pad preferably are absorbed by the adhesive rather than transmitted to the electronic device.

A second consideration is the electrical characteristics of the adhesive. The electronic circuitry which comprises the integrated circuit is generally located on one face of the electronic device. An electric current passing through this circuitry generates heat which the thermal dissipation pad is designed to remove. Thermal dissipation efficiency is improved if the heat dissipating pad physically contacts the heat generating face. It would be detrimental to the operation of the device if electric current could leak from the circuitry to the heat dissipating pad creating an electrical short circuit. The adhesive must have a high dielectric constant. Alternatively, a passivation layer 46 may be utilized. There is a practice in the semiconductor industry to apply a passivation layer to the face of the semiconductor device. The passivation layer 46 is generally applied by the semiconductor device manufacturer and consists of a thin layer of a nonconducting material, for example, silicon dioxide. The passivation layer covers the entire face of the chip except for the active bonding sites 27 which may be raised bumps as illustrated or flat as described hereinafter. The passivation layer thickness is quite small, so the effectiveness of the heat dissipating pad is not greatly diminished.

If a passivation layer is applied to the active face of the electronic device, the adhesive may be any relatively thermally conductive, deformable, compliant adhesive. The elastic modulus of the adhesive should be kept low to prevent transmission of stresses to the electronic device. Some examples of suitable adhesive materials are silicones or adhesives loaded with a powdered metal, such as silver or copper. Since the adhesive is usually a less effective conductor of heat than the heat dissipating pad, it is generally desired to keep the adhesive layer thickness to a minimum. The adhesive is usually a better conductor of heat than air so a void free layer of adhesive covering the entire heat dissipating pad and chip interface is desired.

Figure 10B:
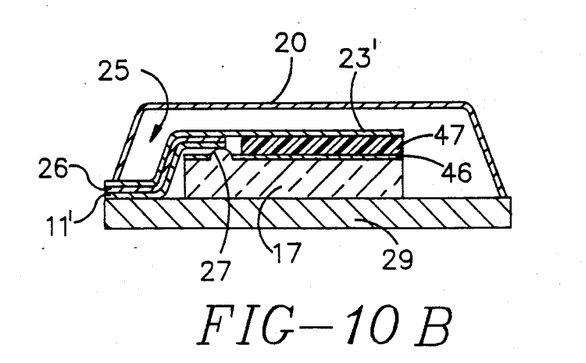
FIG. 10B is a cross-sectional representation of a TAB package incorporating another embodiment of the present invention.

An alternate embodiment is illustrated in FIG. 10B. As in FIG. 10A, a cover component 20 is bonded to a base component 29 with a leadframe 11' disposed between the cover component and the base component. As in the before mentioned embodiment, the cover is bonded to the base component with a suitable sealant. However, in the present embodiment, the leadframe 11' and the heat dissipating pad 23' are part of the same multilayer laminate 25. The first conductive layer of the laminate is formed into the leads 11' while the second conductive layer is formed into the heat dissipating pad 23'. The two layers are separated by a non-conductor 26 so the heat dissipating pad may be any size or shape desired and there is no danger of creating an electrical short by contact with any of the leads.

Figure 11:
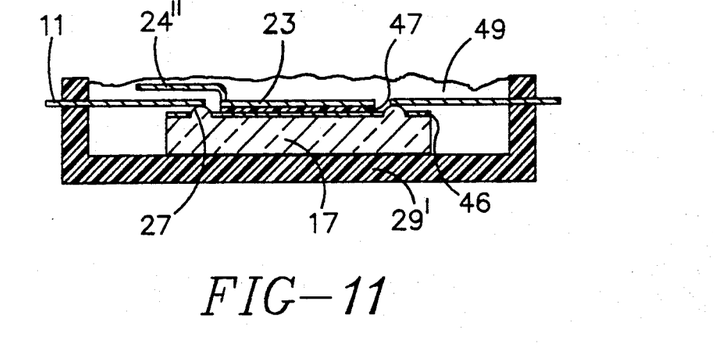
FIG. 11 is a schematic representation of a molded plastic package using the present invention.

Another embodiment of the present invention is illustrated in FIG. 11. The interconnect tape and thermal dissipation pad are incorporated into a molded plastic package. The plastic package contains a molded base component 29' to which a semiconductor device 17 is affixed. The interconnect tape has inner lead portions 12 affixed to bonding sites 27 on the semiconductor chip and outer lead portions 15 which pass through and are molded into the base. The heat dissipating pad 23 is affixed to the semiconductor device with an adhesive layer 47. The heat dissipating support members 24'' are fashioned to lack coplanarity with the leads. The lack of coplanarity eliminates the danger of an electrical short circuit. After the leads and heat dissipating pad are properly positioned within the package base, the base cavity is filled with a resin 49 which is cured to form a solid plastic block to protect the electronic device from the environment and the leads from the vibrations. The resin fills the gap between the leads and the heat dissipating supports to insure electrical isolation.

Figure 12:
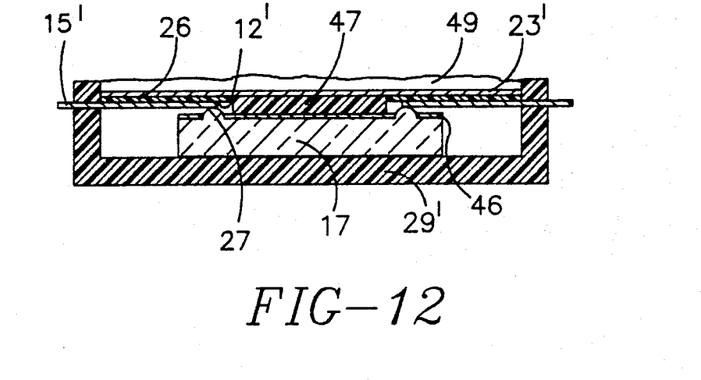
FIG. 12 is another embodiment of a plastic package using the present invention.

Another embodiment of the plastic package is shown in FIG. 12. The interconnect tape is a three layer laminate 25. The bottom copper layer is formed into leads with inner lead portions 12' contacting the silicon chip at bonding bumps 27 and outer lead portions 15' extending through and molded into the package base. The middle layer of the interconnect tape is the insulating layer 26. The top layer 23' is the heat dissipating pad. Because it is electrically isolated from the leadframes, the heat dissipating pad can extend over the entire inner surface area of the package greatly increasing the thermal dissipation abilities of said package. There is nothing limiting the dimensions of the heat dissipating pad 23' to the dimensions of the package. It may extend beyond the package walls to increase convective cooling or for connection to a heat sink device.

Figure 13:
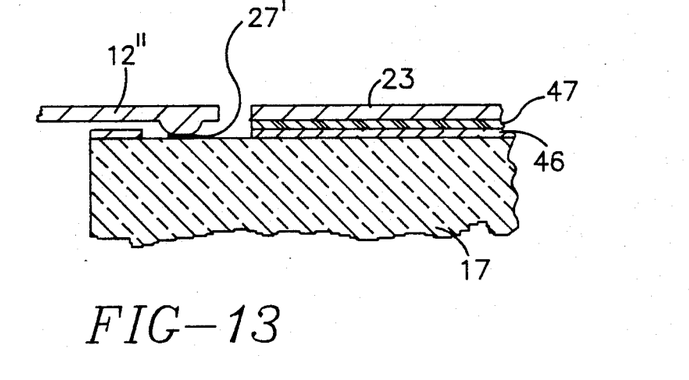
FIG. 13 is a cross-sectional representation of an embodiment with bumped TAB leads.

While the examples and embodiments shown hereinabove illustrate an electronic device with bumped electrical contacts, it is recognized that bumped inner leads and smooth electrical contacts on a semiconductor die may be used. This application hereby incorporates such a design. FIG. 13 shows in cross-section a configuration of the bumped inner leads 12" and smooth bonding site 27'. Generally the bumped inner lead is plated with a precious metal and the smooth bonding site is coated with aluminum to facilitate bonding.

It is apparent that in accordance with this invention, it is possible to configure a tape interconnect with a thermal dissipation pad in contact with the heat generating top face of an electronic device, thereby greatly improving the heat dissipating characteristics of a package assembled from the interconnect tape.

The patents and publications set forth in this specification are intended to be incorporated by reference herein.

It is apparent that there has been provided in accordance with this invention, an improved interconnect tape for use in tape automated bonding which fully satisfies the objects, means, and advantages set forth hereinbefore. While the invention has been described in combination with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

What is claimed is:

1. A tape package housing an electronic component containing electrically active bonding sites on a first heat generating face, said package comprising:
   a housing encasing said electronic component, said housing comprising a base component bonded to a cover component;
   an electrically conductive interconnect tape disposed between said base component and said cover component;
   said tape forming at least one pattern providing leads having free ends bonded to said electrically active bonding sites, a heat dissipating pad spaced apart from said leads and at least one support member extending from the heat dissipating pad to the housing; and
   means indirectly affixing the said heat dissipating pad to said first heat generating face of said electronic component, said means further spacing said heat dissipating pad from said electronic component.

2. The tape package of claim 1 wherein the electrically active bonding sites are surrounded by a passivation layer.

3. The tape package of claim 2 wherein said means is a flexible adhesive.

4. The tape package of claim 3 in which the flexible adhesive is an unfilled silicone.

5. The tape package of claim 3 in which the flexible adhesive is filled with a thermally conductive metal powder.

6. The tape package of claim 3 wherein the heat dissipating pad includes one or more heat dissipating members.

7. The tape package of claim 6 wherein each heat dissipating member is at least one fin angularly bonded to the non-affixed side of the heat dissipating pad.

8. The tape package of claim 7 wherein the bonded end of each said at least one fin is perforated.

9. The tape package of claim 7 wherein the non-bonded end of each said at least one fin is segmented.

10. The tape package of claim 6 wherein the thickness of the heat dissipating pad is non-uniform according to predetermined pattern.

11. The tape package of claim 3 wherein said electrically conductive interconnect tape comprises a single layer of an electrically conductive material.

12. The tape package of claim 11 wherein the thickness of the electrically conductive material is from about 0.0005 inches to 0.006 inches.

13. The tape package of claim 12 wherein the electrically conductive material is comprised of copper or a copper base alloy.

14. The tape package of claim 13 wherein the electrically conductive interconnect tape is comprised of a multi-layer laminate.

15. The tape package of claim 14 wherein the laminate is comprised of a first copper layer and a second copper layer separated by an insulating layer.

16. The tape package of claim 15 wherein the first copper layer is formed into said leads and the second copper layer is formed into said heat dissipating pad and said at least one support member.

17. The tape package of claim 3 wherein the support member end opposite said heat dissipating pad is expandable to occupy up to the entire area between adjacent leads.

18. A tape package housing an electronic component containing electrically active bonding sites on a first heat generating face, said package comprising:
   a housing encasing said electronic component, said housing comprising a molded plastic body;
   an electrically conductive interconnect tape disposed within said molded plastic body;
   said tape forming at least one pattern providing leads having free ends bonded to said electrically active bonding sites, a heat dissipating pad spaced apart from said leads and at least one support member extending from the heat dissipating pad to the housing; and
   means indirectly affixing the heat dissipating pad to said first heat generating face of said electronic component, said means further spacing said heat dissipating pad from said electronic component.

19. The tape package of claim 18 wherein the electrically active bonding sites are surrounded by a passivation layer.

20. The tape package of claim 19 wherein said means is a flexible adhesive.

21. The tape package of claim 20 in which the flexible adhesive is an unfilled silicone.

22. The tape package of claim 20 in which the flexible adhesive is filled with a thermally conductive metal powder.

23. The tape package of claim 20 wherein the heat dissipating pad includes one or more heat dissipating members.

24. The tape package of claim 23 wherein each heat dissipating member is at least one fin angularly bonded to the non-affixed side of the heat dissipating pad.

25. The tape package of claim 24 wherein the bonded end of each said at least one fin is perforated.

26. The tape package of claim 24 wherein the non-bonded end of each said at least one fin is segmented.

27. The tape package of claim 23 wherein the thickness of the heat dissipating pad is non-uniform according to a predetermined pattern.

28. The tape package of claim 20 wherein said electrically conductive interconnect tape comprises a single layer of an electrically conductive material.

29. The tape package of claim 26 wherein the thickness of the electrically conductive material is from about 0.0005 inches to 0.0006 inches.

30. The tape package of claim 29 wherein the electrically conductive material is comprised of copper or a copper based alloy.

31. The tape package of claim 20 wherein the electrically conductive interconnect tape is comprised of a multilayer laminate.

32. The tape package of claim 31 wherein the laminate is comprised of a first copper layer and a second copper layer separated by an insulating layer.

33. The tape package of claim 32 wherein the first copper layer is formed into said leads and the second copper layer is formed into said heat dissipating pad and said at least one support member.

34. The tape package of claim 20 wherein the support member end opposite said heat dissipating pad is expandable to occupy up to the entire area between adjacent leads.

* * * * *